(12) United States Patent
Chen

(10) Patent No.: US 6,474,570 B2
(45) Date of Patent: Nov. 5, 2002

(54) FLEXIBLE NOZZLE SYSTEM FOR GAS DISTRIBUTION PLATE OF PLASMA REACTION CHAMBER

(75) Inventor: Chien-Wei Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/812,048

(22) Filed: Mar. 19, 2001

(65) Prior Publication Data

US 2002/0084352 A1 Jul. 4, 2002

(30) Foreign Application Priority Data

Dec. 29, 2000 (TW) ........................................ 89128259 A

(51) Int. Cl.[7] ................................................. B05B 1/14
(52) U.S. Cl. .................... 239/548; 239/550; 239/553.3; 239/566; 239/589; 239/601; 239/600; 239/390
(58) Field of Search ................................. 239/548, 550, 239/553.3, 566, 589, 601, 390, 568, 597, 600

(56) References Cited

U.S. PATENT DOCUMENTS

| | | | | |
|---|---|---|---|---|
| 103,116 A | * | 5/1870 | Yergason | |
| 2,204,802 A | * | 6/1940 | Gessler | |
| 3,771,730 A | * | 11/1973 | Nicoloff et al. | 239/550 X |
| 3,834,629 A | * | 9/1974 | Hellman et al. | 239/597 X |
| 4,699,047 A | * | 10/1987 | Lee et al. | 239/566 X |
| 4,930,706 A | * | 6/1990 | Merlin | 239/600 X |

* cited by examiner

Primary Examiner—Robin O. Evans
(74) Attorney, Agent, or Firm—J.C. Patents

(57) ABSTRACT

A flexible nozzle system for the gas distribution plate of a plasma reaction chamber. The gas distribution plate is a metal plate having a plurality of clamping holes and a plurality of removable nozzle modules inserted into the clamping holes.

12 Claims, 2 Drawing Sheets

FLEXIBLE NOZZLE SYSTEM FOR GAS DISTRIBUTION PLATE OF PLASMA REACTION CHAMBER

CROSS-REFERENCE TO RELATED APPLICATION

This application claims the priority benefit of Taiwan application serial no. 89128259, filed Dec. 29, 2000.

BACKGROUND OF THE INVENTION

1. Field of Invention

The present invention relates to a gas distribution plate design. More particularly, the present invention relates to a flexible nozzle system for the gas distribution plate of a plasma reaction chamber.

2. Description of Related Art

Plasma is often employed in the fabrication of semiconductor devices and circuits. For example, in thin film deposition, plasma is used for sputtering and plasma-enhanced chemical vapor deposition (PECVD). Plasma is also one of the principle techniques in dry etching operations. In ion implantation, the ion source of an implanting machine is actually plasma produced by conventional plasma production methods. In addition, the ozone used in a tetra-ethyl-ortho-silicate/ozone (TEOS/$O_3$) chemical vapor deposition is also produced from oxygen by a plasma method.

Plasma etching is an anisotropic etching process in which particles are accelerated to a high energy level before being bombarded upon a silicon wafer. FIG. 1 is a schematic cross-sectional view of a conventional plasma reaction chamber. As shown in FIG. 1, gases 100 flow into a reaction chamber 106 via nozzle holes 104 on a gas distribution plate 102 near the top of the chamber. By applying a voltage to the low-pressure gases 100 inside the reaction chamber 106, neutral gaseous molecules are activated and hence forced to dissociate into ions, radicals, molecular fragments and electrons. These particles are accelerated by electric field to high energy before bombarding against a silicon wafer 108 target.

FIG. 2 is a schematic cross-sectional diagram of a portion of the gas distribution plate shown in FIG. 1. As shown in FIG. 2, the gas distribution plate 200 and the nozzle holes 202 in the plate form an integrated unit. The gas distribution plate 200 is made from aluminum, for example and the nozzle holes 202 are formed by drilling. Furthermore, a layer of anodized film 204 (for example, an aluminum oxide $Al_2O_3$) is formed over the plate 200 by cathode plating. In general, complicated steps are required to fabricate a gas distribution plate having an appropriate nozzle profile for producing a fluid field suitable for a particular application. In addition, particles and high molecular weight polymers can easily accumulate around and between nozzle holes 202. These accumulated particles are difficult to remove in wet cleaning. Furthermore, since the anodized film 206 inside the nozzle holes 202 is frequently bombarded by high-energy plasma during operation, punch-through of the anodized film 206 may occur. As soon as the anodized film 206 is broken somewhere, the gas distribution plate 200 is no longer usable and needs to be replaced. Hence, the gas distribution plate 200 often has a short life expectancy.

SUMMARY OF THE INVENTION

Accordingly, one object of the present invention is to provide a flexible nozzle system in the gas distribution plate of a plasma reaction chamber. Utilizing plasticity and plasma-resisting properties of engineering plastic, the nozzles are fabricated using engineering plastic and employ a modular, flexible and removable design.

A second object of this invention is to provide a flexible nozzle system for the gas distribution plate of a plasma reaction chamber. Through shaping the internal profile of the removable nozzles, a desired gas flow pattern inside the reaction chamber is obtained.

To achieve these and other advantages and in accordance with the purpose of the invention, as embodied and broadly described herein, the invention provides a flexible nozzle system for the gas distribution plate of a plasma reaction chamber. The flexible nozzle system on the gas distribution plate includes a metal plate having a plurality of nozzle engagement holes formed by drilling such that a plurality of removable nozzle modules can easily be gripped by the engagement holes.

This invention also provides a type of removable nozzle module having a cap section with screw slot thereon for rotation and an engaging section linked to the cap section. Each removable nozzle module has a nozzle hole in the middle linking up the engaging section and the cap section.

In brief, this invention provides a nozzle system made from engineering plastic for the gas distribution plate of a plasma reaction chamber. Since nozzles made from engineering plastic can be easily shaped and are resistant to plasma corrosion, the nozzle can be easily cleaned. Moreover, each plastic nozzle can be mounted or dismounted separately. Hence, operating cost can be reduced. Furthermore, the nozzle hole can be shaped into a variety of different profiles because engineering plastic is a workable material. In addition, different gaseous flow patterns can be produced by inserting different types of nozzle modules on the gas distribution plate. Ultimately, a uniform gaseous flow can be produced inside the plasma reaction chamber and a higher wafer yield can be obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
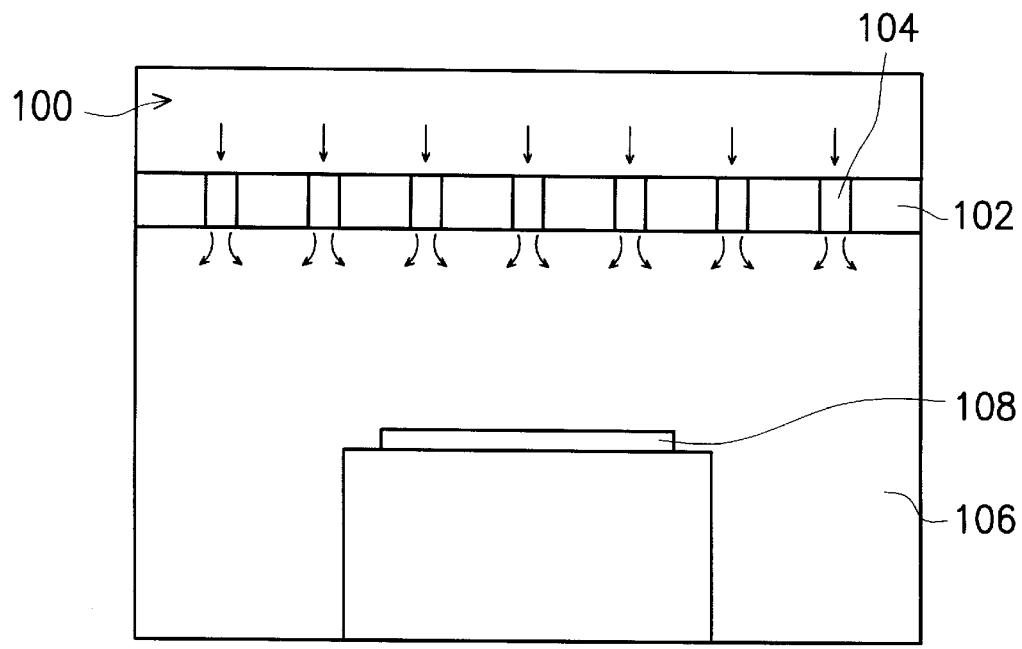
FIG. 1 is a schematic cross-sectional view of a conventional plasma reaction chamber.
Figure 2:
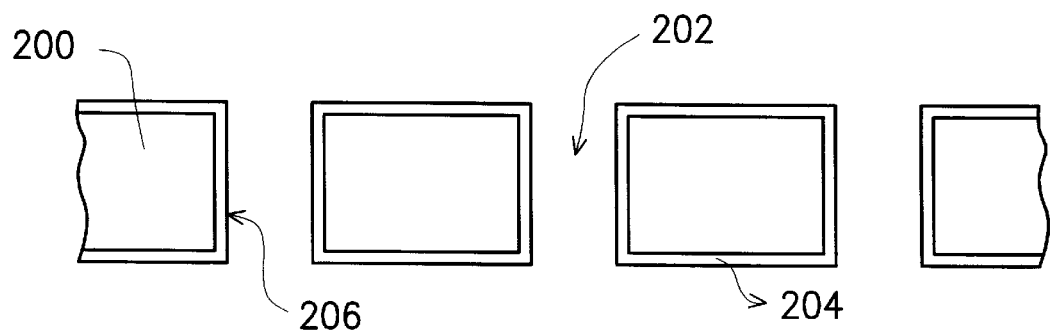
FIG. 2 is a schematic cross-sectional diagram of a portion of the gas distribution plate shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
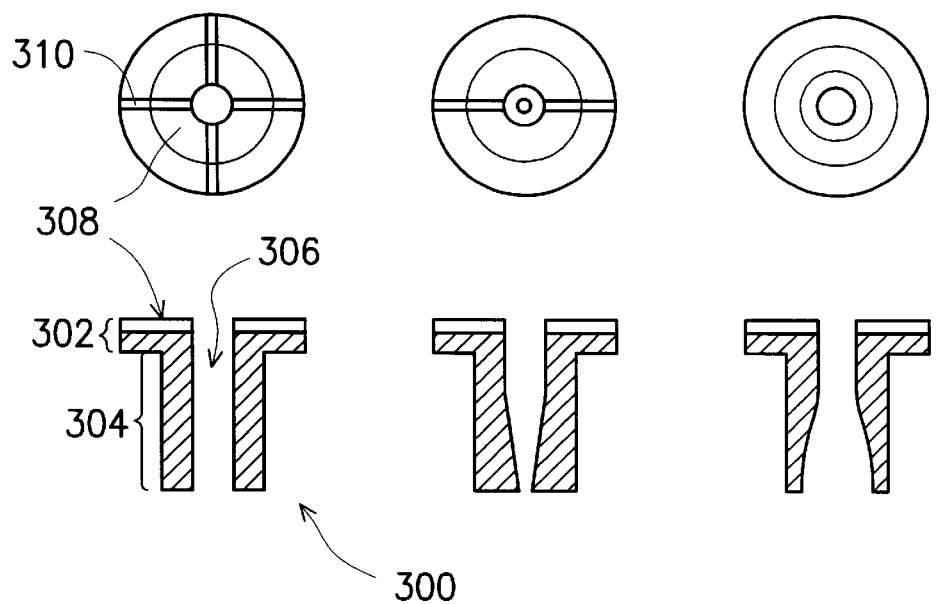
FIG. 3 is a diagram showing the top view and corresponding cross-sectional view of a few removable engineering plastic nozzles fabricated according to the preferred embodiment of this invention.

FIG. 3 is a diagram showing the top view and corresponding cross-sectional view of a few removable engineering plastic nozzles fabricated according to the preferred embodiment of this invention. As shown in FIG. 3, the nozzle module 300 can be divided into a cap section 302 and an engaging section 304. The cap section 302 and the engaging section 304 are joined together with a nozzle hole 306 in the center linking up the two sections. An upper surface 308 of the cap section 302 has a screw slot 310, for example, in the shape of a "+", "−", "*" or a hexagon. Through a manual tool such as a screwdriver or a hex key, the nozzle module 300 can be dismantled. The engaging section 304 may have a smooth or threaded outer surface. The nozzle hole 306 at the center links up the cap section 302 and the engaging section 304 permitting gases to pass through. The nozzle hole 306 may be shaped into a variety of profiles such as a straight, a diverging or a converging profile.

The nozzle modules 300 are made from engineering plastic. Due to the plasma-resisting properties of engineering plastic, punch-through of anodized film in and surrounding the nozzle hole 306 region is prevented. In addition, plasticity of the engineering plastic permits the shaping of the nozzle hole 306 into a variety of different profiles. Different nozzle hole 306 profiles can produce slightly different effects in plasma operation inside the reaction chamber. For example, the speed of a gas will drop after passing through a diverging nozzle, and hence may result in a lower gas density and a smoother flow. On the other hand, if a gas is forced through a converging nozzle, a higher gas density and a chaotic flow may emerge at the other end.

Figure 4:
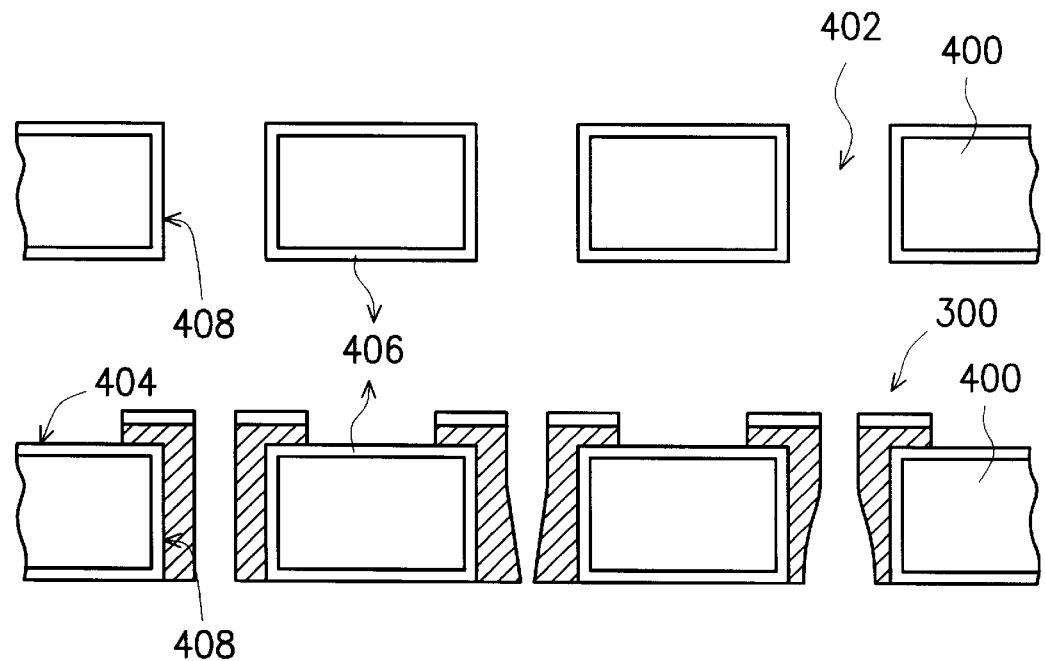
FIG. 4 is a schematic cross-sectional view of a gas distribution plate with a few removable plastic nozzles fabricated according to this invention.

FIG. 4 is a schematic cross-sectional view of a gas distribution plate with a few removable plastic nozzles fabricated according to this invention. As shown in FIG. 4, a metal plate 400 is provided. The metal plate 400 can be, for example, an aluminum plate having a circular or rectangular shape. Through holes are drilled in the metal plate 400. An anodized film processing is conducted to form an anodized film 406 over the metal plate 400. Hence, nozzle module clamping holes 402 are formed in the metal plate 400. The engaging section 304 of the nozzle module 300 can engage with the clamping holes 402 in the metal plate 400. This is because each nozzle module clamping holes 402 has a profile that corresponds with the smooth or threaded outer surface of the engaging section 304 of the nozzle module 300. Hence, the nozzle module 300 can be easily inserted or screwed into the clamping holes 402 or disengaged from the clamping holes 402 with a manual tool. With all necessary nozzle modules inserted into the metal plate 400, a gas distribution plate 404 is produced. A plurality of nozzle modules 300 can be inserted into the metal plate 400 to form a gas distribution plate 404 that simply improves uniformity of gaseous flow. Alternatively, different types of nozzle modules may be inserted into the metal plate 400 to produce a gas distribution plate 404 that creates a particular type of gaseous flow pattern. The nozzle system of this invention is not limited to application inside a plasma reaction chamber. In fact, the nozzle system on the gas distribution plate can also be used in other processing chambers to create a desired gas flow pattern.

In conclusion, the advantages of this invention includes:

1. Using engineering plastic as the base material for forming the nozzle module permits the shaping of nozzle holes into different profiles that serve a variety of functions.

2. A combination of nozzle modules with different nozzle profiles is possible so that a particular gaseous flow pattern necessary for reaction is created.

3. Since the nozzle module is fabricated using plasma-resisting engineering plastic, damage to the anodized film coated over the gas distribution plate due to bombardment by high-energy plasma is greatly reduced.

4. All the nozzle modules can be dismantled for cleaning or replacement. Hence, component cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A gas distribution structure of a plasma reaction chamber, comprising:

a metal plate having a plurality of nozzle module clamping holes for distributing gas, on which an anodized film is coated; and a plurality of removable nozzle modules, each of the removable nozzle module comprising:

a cap section;

an engaging section joined to the cap section; and a nozzle hole in the nozzle module that links up both the cap section and the engaging section and permits a gas to pass through, wherein each removable nozzle module engages with the nozzle module clamping holes onto the metal plate and covers the anodized film lining the nozzle module clamping holes and rims thereof.

2. The structure of claim 1, wherein a material constituting the removable nozzle modules includes engineering plastic.

3. The structure of claim 1, wherein a shape of the screw slot is selected from the group consisting of "+", "−", "*" and hexagon.

4. The structure of claim 1, wherein the nozzle hole has a converging profile.

5. The structure of claim 1, wherein the nozzle hole has a diverging profile.

6. The nozzle system of claim 1, wherein the metal plate includes a circular metal plate.

7. The nozzle system of claim 1, wherein the metal plate includes a rectangular metal plate.

8. The structure of claim 1, wherein the nozzle module clamping holes in the metal plate have a smooth profile, while an outer surface of the engaging section has a smooth profile.

9. The structure of claim 1, wherein the nozzle module clamping holes in the metal plate have a threaded profile, while an outer surface of the engaging section has a threaded profile.

10. The structure of claim 1, wherein nozzle hole has a straight profile.

11. The structure of claim 1, wherein the cap section has a hexagonal shape.

12. The structure of claim 1, wherein the cap section has a circular shape.

* * * * *